United States Patent
Okamoto et al.

[11] Patent Number: 5,891,291
[45] Date of Patent: Apr. 6, 1999

[54] METHOD FOR MANUFACTURING LAMINATE AND APPARATUS FOR MANUFACTURING SAME

[75] Inventors: Takeshi Okamoto; Kazushi Kawamura; Hirohiko Tohgeyama; Hiroshi Maeda, all of Kadoma, Japan

[73] Assignee: Matsushita Electric Works, Ltd., Osaka, Japan

[21] Appl. No.: 62,430

[22] Filed: Apr. 17, 1998

Related U.S. Application Data

[63] Continuation of Ser. No. 783,919, Jan. 17, 1997, abandoned.

[30] Foreign Application Priority Data

Jan. 18, 1996 [JP] Japan ............................. 8-6375
Aug. 21, 1996 [JP] Japan ............................. 8-219542

[51] Int. Cl.$^6$ ................................................ B32B 31/20
[52] U.S. Cl. ....................... 156/273.9; 156/272.2; 156/311; 156/498; 165/171; 165/176
[58] Field of Search ............................ 156/272.2, 273.9, 156/309.6, 311, 282, 498; 165/168, 171, 176; 123/41.29, 41.54

[56] References Cited

U.S. PATENT DOCUMENTS

| | | |
|---|---|---|
| 2,509,439 | 5/1950 | Langer . |
| 2,828,948 | 7/1958 | Caldwell, Jr. et al. . |
| 3,532,570 | 10/1970 | Cotter . |
| 3,960,635 | 6/1976 | La Roy et al. . |
| 4,390,485 | 6/1983 | Yang . |
| 4,928,755 | 5/1990 | Dotz et al. . |
| 5,547,535 | 8/1996 | Ceraso . |
| 5,615,470 | 4/1997 | Ceraso . |

FOREIGN PATENT DOCUMENTS 1 321 305   5/1970   United Kingdom .

OTHER PUBLICATIONS

Japanese Publication No. 62–58903 pp. 127–131 (abstract) Dec. 3, 1998.

*Primary Examiner*—Sam Chuan Yao
*Attorney, Agent, or Firm*—Lynn & Lynn

[57] ABSTRACT

A method for manufacturing a laminate includes steps of forming a laminated combination of synthetic resin sheet material with a metal foil laminated each other, thermoforming under a pressure the laminated combination while supplying an electric current to the metal foil, and, after termination of the current supply, cooling thus obtained laminate while further applying a pressure, whereby the laminated combination can be uniformly heated into its core part to allow the laminate of uniform quality to be obtained, while shortening manufacturing lead time and minimizing surface roughness.

4 Claims, 16 Drawing Sheets

WATER

AIR

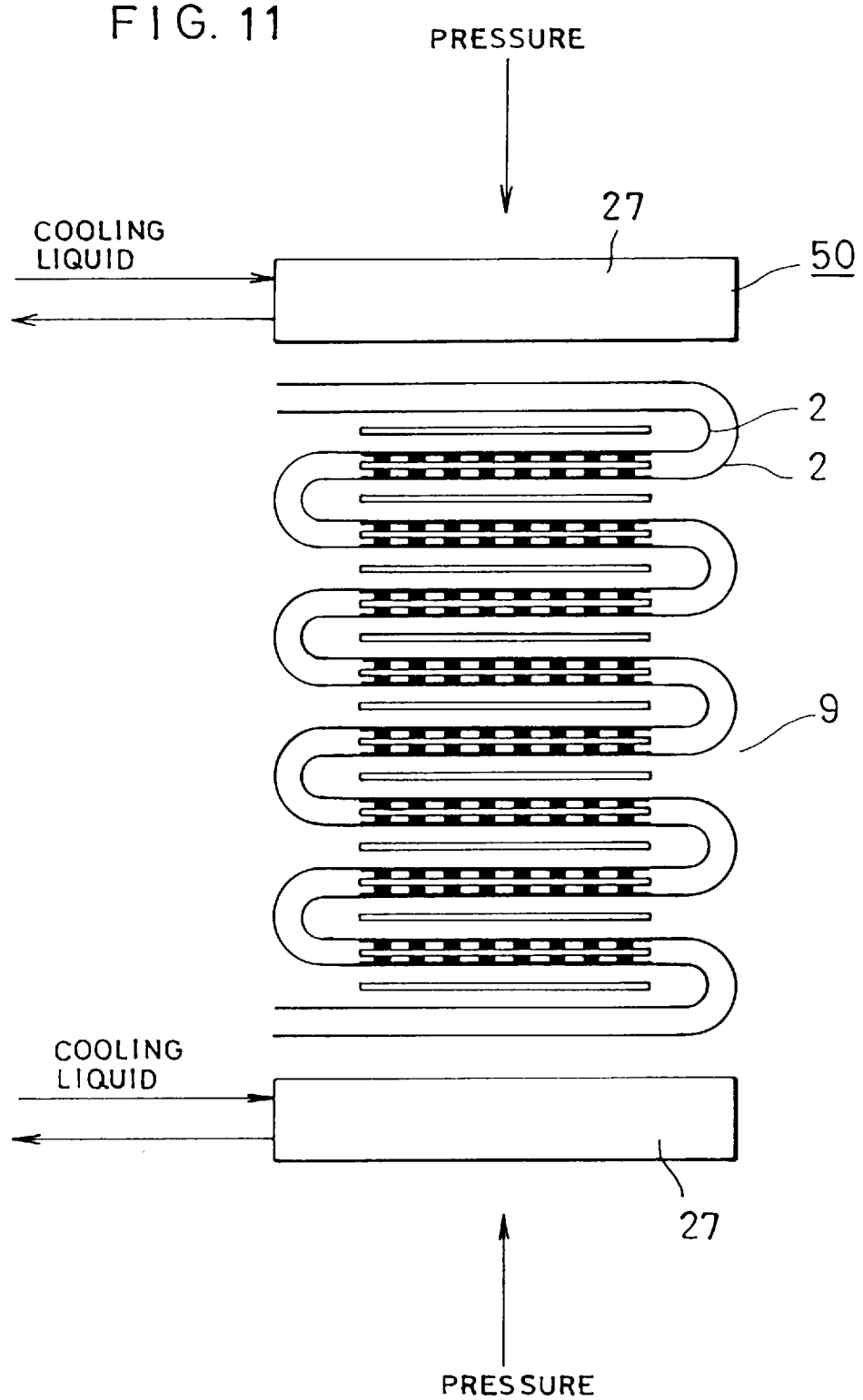

THERMOCOUPLE — 55

MEASURING TEMPERATURE OF COOLING LIQUID

MEASURING VALVE OF ELECTRIC RESISTANCE

FIG. 20A
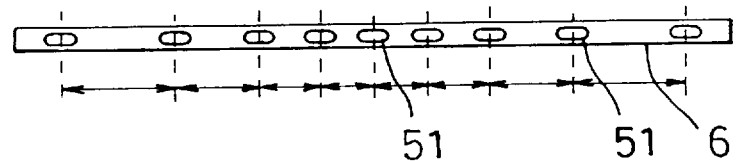
FIG. 20B
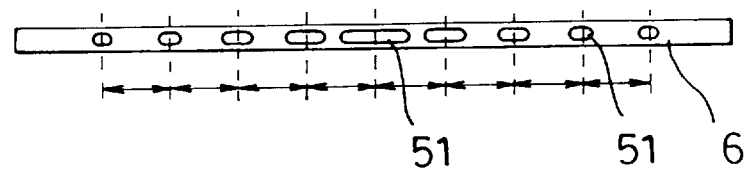
FIG. 20C  FIG. 20D  FIG. 20E
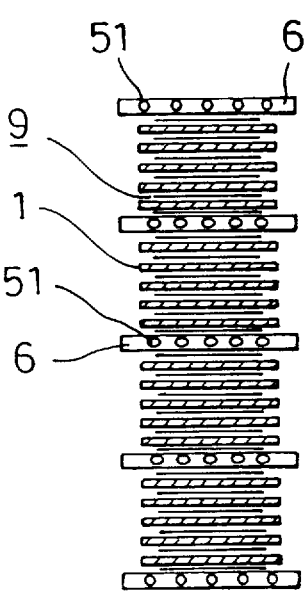 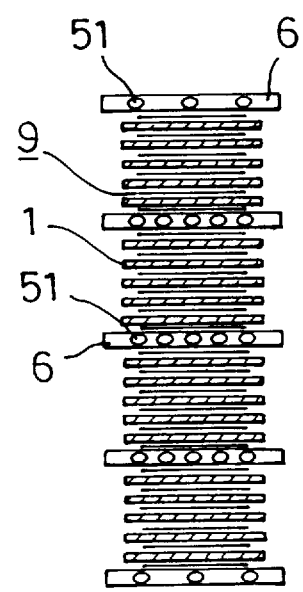 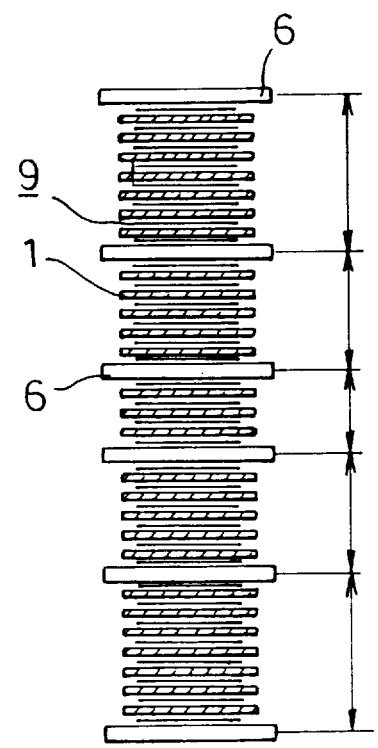

METHOD FOR MANUFACTURING LAMINATE AND APPARATUS FOR MANUFACTURING SAME

This is a continuation of application Ser. No. 08/783,919 filed on Jan. 17, 1997 now abandoned.

BACKGROUND OF THE INVENTION

This invention relates to a method for manufacturing a laminate and an apparatus for manufacturing the same and, more specifically, to a method for manufacturing the laminate by laminating a sheet-shaped synthetic resin material and metal foil into a stack, and thermoforming the stack integrally into the laminate under a pressure while supplying an electric current to the metal foil, and to an apparatus for performing the manufacturing method.

DESCRIPTION OF RELATED ART

The laminate having the metal foil on the surface has been obtained as an integral laminated molding of the sheet-shaped resin material with the metal foil. The laminate employing a copper foil or the like as the metal foil and a prepreg as the sheet-shaped resin material has been frequently used in printed circuit board and so on. Such laminate is obtained by laminating the metal foil and prepreg only, or with any internal layer member interposed, or with internal and external layer members in combination with the metal foil and prepreg, heating them under a pressure to melt the synthetic resin of the prepreg, and molding them through a thermosetting or cooling. The heating under pressure may be performed through a hot press with such heat source as steam or electric heating employed, or through a vacuum press.

The hot press is to press the laminated prepregs or the like members from both of upper and lower sides by means of pressing plates heated, whereas the vacuum press is performed by covering the laminated members hermetically with a packing member, vacuuming its interior, and applying to its periphery a hot gas under a high pressure. In carrying out the laminated molding by means of such hot press or vacuum press, it is general that one set of such members as a plurality of prepregs which forming one laminate is made to a laminated combination, a plurality of such sets of the laminated combinations are stacked with each of interlayers interposed between adjacent ones of the laminated combinations to be a laminated block, and a plurality of the laminates can be simultaneously obtained by heating and pressing the laminated block. The interlayers are employed for ensuring the flatness of respective products, and stainless steel plates or the like are generally employed.

When the laminated combinations stacked into multiple layers as in the above are to be heated under the pressure by means of the hot press, the laminated block is heated from both of the upper and lower sides with pressure plates of the molding press. Accordingly, there arises a difference in the heating temperature between the laminated combination on the pressure plate side and the laminated combination in a middle portion, due to a delay in the heat transfer and a heat radiation from side surfaces of the laminated block. Such non-uniform heating temperature is not preferable since it results in a fluctuation of the quality of the products of obtainable laminates. In the hot presss, however, the number of the laminated combinations allowed to be stacked is limited.

In the vacuum press, on the other hand, the heat is applied to the laminated block from its periphery, and the temperature of the respective laminated combination is to be substantially uniformly raised, but there still arises a temperature difference between outer peripheral parts and core part due also to the delay in the heat transfer. For this reason, the molding of the laminate having a large area has been uneasy.

As one of measures for eliminating such drawbacks as in the above, for example, U.K. Patent No. 1,321,305 discloses a method, according to which a larger number of the laminates are simultaneously molded by stacking the laminated combinations in multiple stages with synthetic resin sheets respectively interposed between metal plates, and heating them with an electric power supplied to the metal plates. With such heating method, the heating temperature is made uniform in both of stacking direction and planar direction of the laminates, and any variability of quality is minimized. In Japanese Patent Publication No. 62-58903, there has been disclosed a method in which a laminated material of the metal foils and thermoplastic resin sheets are supplied through feed rollers onto metallic rollers, and feeding an electric current to the metal foils with the metallic rollers used as electrodes, so as to perform a hot heat bonding with the metal foils utilized directly as a heating unit. According to this method, the heating temperature can be applied uniformly in the planar direction of the laminate, and any variability of interplanar quality of the laminate is minimized.

However, the foregoing known methods involve a drawback in respect that the cooling is required to be of natural heat radiation performed without application of any pressure. In respect of this drawback, description shall be detailed in the followings with reference to a case where a copper-clad laminate is molded as the laminate from a combination of the prepreg and copper foil, the prepreg being a glass cloth impregnated with epoxy resin.

That is, upon manufacturing such laminate, the epoxy resin shows a remarkable contraction until the epoxy resin reaches the glass transition temperature during the cooling so that, in the absence of any pressing force, weave pattern of the glass cloth, in particular, crossing parts of respective yarns of bundled glass fibers are caused to strike through the copper foil, and the copper clad laminate is deteriorated in the surface roughness. When the laminate is cooled through the natural heat radiation in zero-pressure state, a measurement of the surface roughness in diagonal direction with respect to the yarns by means of a tracer type surface-roughness meter shows a surface roughness of 4 to 7 $\mu$m in Rmax, which is remarkably larger than lpm level in the case of cooling under a pressure. Therefore, there has been a problem that the thus obtained laminate is not suitable for forming a dense circuit pattern through an etching or the like circuit formation, in order to process the laminate into the printed-wiring board. It has been another problem that the cooling through the natural heat radiation results in a prolongation of the manufacturing lead time.

SUMMARY OF THE INVENTION

An object of the present invention is to provide a method for manufacturing the laminate and an apparatus for performing the method, which can overcome the foregoing drawbacks and obtain the laminate of uniform quality through uniform heating of the laminated combination up to the central core part, while shortening the manufacturing lead time and minimizing the surface roughness.

In particular, the present invention provides a laminate manufacturing method and an apparatus for performing the method, which can easily form a fine circuit pattern when the laminate is applied to the printed circuit board.

The present invention further provides a laminate manufacturing method and an apparatus therefor, which can minimize the variability of quality between the respective laminates stacked into multiple stages, in manufacturing a larger number of the laminates simultaneously.

According to the present invention, the above objects can be established by a laminate manufacturing method comprising the steps of forming a laminated combination with sheet-shaped synthetic resin material and metal foil laminated on each other, and thermoforming under a pressure the combination into the laminate while supplying an electric current to the metal foil in the combination, characterized in that, after termination of the electric current supply, the laminate is cooled while further applying thereto a pressure.

According to this laminate manufacturing method, the metal foil acts as a resistor and is caused to generate a heat, and the laminated combination is heated thereby. Further, by the pressure applied during the cooling, the laminate is made to set while maintaining the flatness of the surface, and required time for the cooling is to be shortened.

Other objects and advantages of the present invention shall become clear as the description of the invention advances as detailed with reference to preferred embodiments shown in accompanying drawings.

BRIEF DESCRIPTION OF THE DRAWINGS

FIG. 11 shows in a schematic side elevation a laminate manufacturing apparatus in a nineth embodiment of the present invention;

FIG. 20A is an explanatory view for different cooling state with the interlayer of FIG. 15;

FIG. 20B is a sectioned view of the interlayer of FIG. 20A;

FIGS. 20C to 20E are side elevations of the laminated block of FIG. 15;

Figure 1:
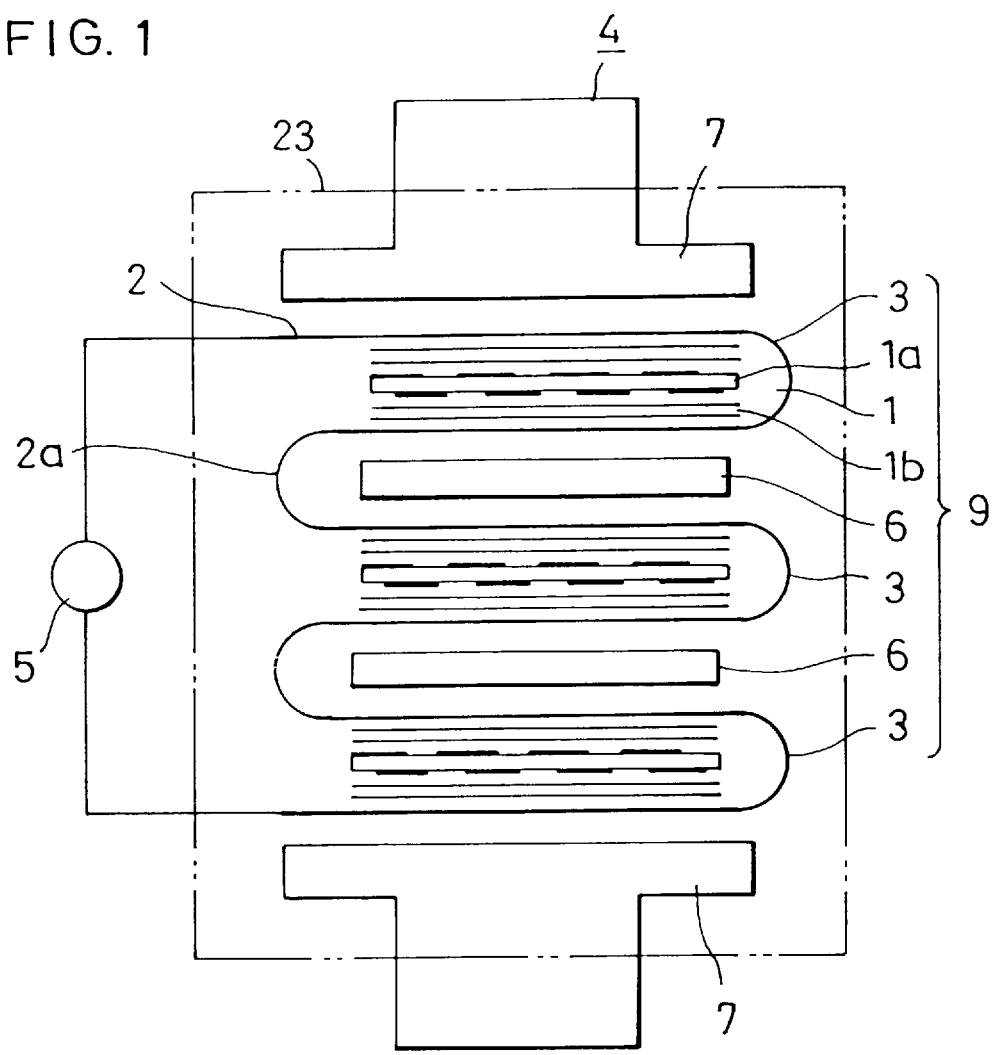
FIG. 1 shows in a schematic side elevation a manufacturing apparatus for the laminate in a first embodiment according to the present invention.

While the present invention shall now be described with reference to the respective embodiments shown in the drawings, it should be appreciated that the intention is not to limit the invention only to these embodiments shown but rather to include all alterations, modifications and equivalent arrangements possible within the scope of appended claims.

DETAILED DESCRIPTION OF THE PREFERRED EMBODIMENTS

Figure 2:
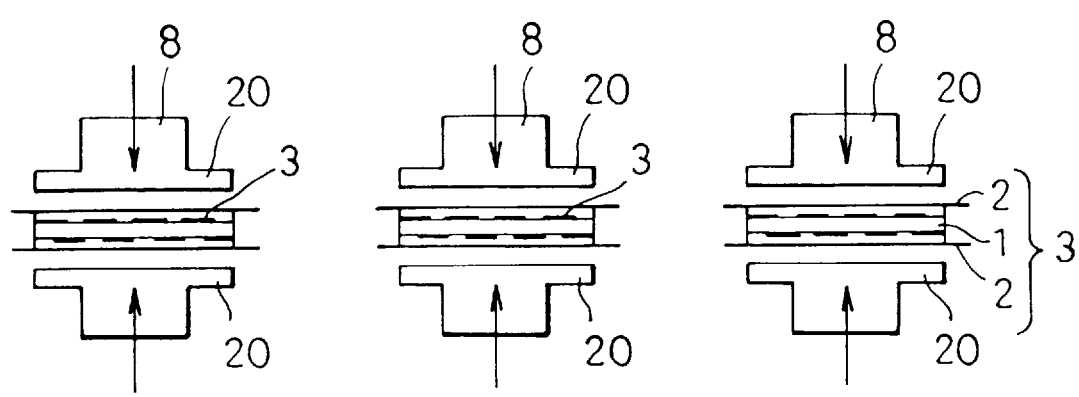
FIG. 2 is a schematic side elevation for explaining a cooling device in the laminate manufacturing apparatus of FIG. 1.

First embodiment of the present invention is shown in FIGS. 1 and 2, in which a laminate manufacturing apparatus is constituted by combining a molding press 4 with an electric heating device 5. The molding press 4 is to mold under a pressure a laminated combination 3 formed by laminating a synthetic resin sheet 1 and a metal foil 2 each other. At the same time, the electric heating device 5 supplies to the metal foil 2 an electric current to generate a heat, the resin sheet 1 is thereby heated, and the laminated combination 3 is thermoformed under a pressure to be formed into a laminate.

For the metal foil 2, one of continuous length is used, and the electric current is supplied from one end to the other end of the metal foil 2 of continuous length. In respect of the resin sheet 1, a larger number of the sheets will be simultaneously treated in the following manner.

That is, the resin sheet 1 is placed on the metal foil 2 to be close to one end of the foil 2, then the metal foil 2 is folded back over the resin sheet 1 to wrap up the sheet, with the metal foil 2 positioned on both sides of the resin sheet 1, and the laminated combination 3 is thereby formed. Next, an interlayer 6 electrically insulating and smooth in its surfaces is placed on top side of the metal foil 2 forming the laminated combination 3, the foil 2 is again folded back in opposite direction to be over the interlayer 6 to wrap up the same, the placing and folding back are thus repeated in the same manner, so as to laminate alternately the resin sheets 1 and interlayers 6 with the metal foil 2 interposed between them, whereby a laminated block 9 is formed with a plurality of the laminated combinations 3 including the interlayers 6 respectively interposed between adjacent ones of the combinations stacked into multiple stages.

While in the illustrated embodiment one continuous length of the metal foil 2 is employed, it is possible to employ two separate sheets of the metal foil 2, by disposing each of the two metal foils 2 on each of both sides of the laminated combinations 3.

Here, the laminated block 9 is subjected to a pressure as held between upper and lower pressing plates 7 which forming parts of the molding press 4 which are contacting with the top and bottom of the laminated block 9, and three of the laminates in the illustrated embodiment are simultaneously manufactured. By increasing the number of stack, it is possible to mold a larger number of the laminates simulnateously.

The direction in which the pressure is applied with the molding press 4 may be modified from such vertical direction as shown to horizontal direction. Further, as shown by an imaginary line in FIG. 1, the molding press 4 may be modified to be a vacuum laminate press in which pressing members are enclosed in a vacuum chamber 23.

As shown in FIG. 2, further, a cooling device in the laminate manufacturing apparatus of this embodiment comprises opposing pairs of cooling plates 20 interporating therein cooling water pipe or the like for cooling the plate itself, respective pairs of which plates 20 are forming molding presses 8, and three sets of such cooling and molding presses 8 are disposed for simultaneously manufacturing three of the laminates as simultaneously cooled. Thus, the foregoing laminated combinations 3 respectively formed into the laminate through the heating and molding are taken out, as the electric heating of the metal foil 2 is terminated, and are further pressed while being cooled simultaneously by means of the cooling and molding presses 8.

Referring more specifically to respective materials employed, the sheet-shaped synthetic resin material 1 comprises a set of an internally layered substrate of glass cloth impregnated with epoxy resin and having on both sides internally layered circuits, and prepregs of glass cloth impregnated with epoxy resin and disposed on both sides of the substrate. For the metal foil 2, a copper foil of 18 $\mu$m thick is used. With these members, it is possible to manufacture multilayered circuit board of four layer structure, as the laminate. As the interlayer 6, a metal plate of flat and smooth surfaces may be employed.

Further, the metal foil 2 is a single continuous copper foil, which is used in a meandering shape with respective folded edges 2a positioned alternately on opposite side of the respective laminated combinations 3. A vacuum laminating press is employed as the molding press 4, in which the interior of the vacuum chamber 23 is evacuated to a vacuum of 10 Torr, thereafter the pressing is performed with a pressure of 10 kgf/cm$^2$ applied to both of top and bottom sides of the laminated block 9 and the heating is simultaneously carried out by supplying a DC current from a source of the electric heating device 5 to the continuous copper foil connected at both ends to the source for causing the foil to act as an electric resistor to have a heat generated thereby. Temperature of the laminated combination 3 being heated is measured by means of a thermocouple so that the heating press will be performed for 100 minutes while subjecting the current value to a feedback control to achieve 180° C.

The respective laminates thus obtained through the heating and pressing are released as disassembled, and they are subjected to the cooling down to be below the glass transition temperature of the resin constituting the laminates, while similarly applying a pressure of 10 kgf/cm$^2$ by means of the cooling and molding presses 8.

In the case of the laminate obtained by cooling through the natural heat radiation without application of pressure, the surface roughness is 3 to 7 $\mu$m in Rmax, whereas the laminate cooled down to be below the glass transition temperature of the resin under the pressure being applied, as in the foregoing embodiment of the present invention, will have such small surface roughness as to be less than about 1 $\mu$m. Further, in the case when the laminate is cooled through the natural heat radiation as left being pressed within the molding press 4, it takes about 30 minutes until the temperature of the laminate drops to be below the glass transition temperature, whereas, in the case when the laminate is cooled in the foregoing cooling and molding press 8, the required time for cooling down to be below the glass transition temperature is about 30 seconds, and the manufacturing lead time could have been effectively shortened.

It is also possible to have the laminated blocks 9 cooled by embedding in the pressing plates 7 of the molding press 4 shown in FIG. 1 a cooling pipe for circulating such refrigerant as water or air, and supplying water or air through the cooling pipe in the pressing plates 7 after termination of the electric heating. In this case, the molding press 4 is high in the usability because the same molding press can be used also for the cooling without requiring the laminates which are hot to be released, while similarly minimizing the surface roughness to be less than lpm and shortening the manufacturing lead time such that the required temperature dropping time below the glass transition temperature is about 40 seconds.

Further, such cooling under a pressure employing the cooling and molding press 8 can be constituted in combination with a cooling device in another embodiment described in the followings.

Figure 3A:
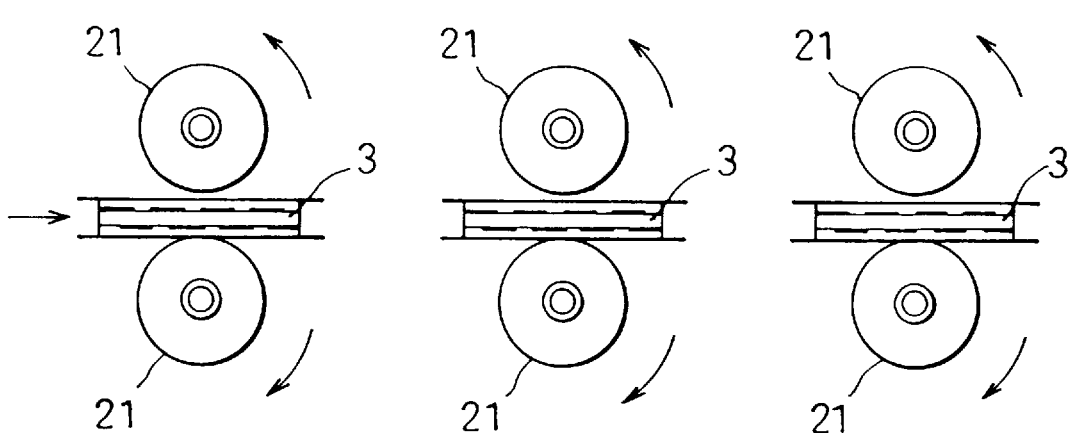
FIG. 3A is a schematic explanatory view for a cooling device in a laminate manufacturing apparatus in a second embodiment of the present invention.
Figure 3B:
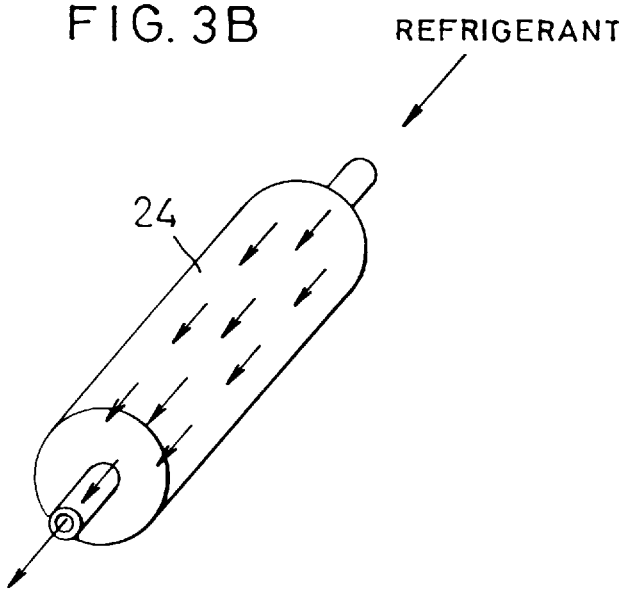
FIG. 3B is a schematic perspective view of a cooling roller employed in the device of FIG. 3A.

In FIGS. 3A and 3B, there is shown the cooling device employed in the laminate manufacturing apparatus in a second embodiment, in which the cooling and molding presses 8 forming the cooling device in the foregoing embodiment are replaced by cooling rollers 21. That is, the present cooling device comprises three pairs of the cooling rollers 21 respectively opposed one another in upper and lower relationship, and the obtained laminates released as disassembled from the molding press 4 are passed through the three pairs of the cooling rollers 21 sequentially while being pressed under a pressure of 10 kgf/cm$^2$ and at a proper feeding speed for cooling the laminates to be below the glass transition temperature of epoxy resin employed. The cooling rollers in this cooling device are respectively formed, as shown in FIG. 3B, for allowing such refrigerant as water or air to pass through the interior.

With the cooling under pressure by means of such cooling device as shown in the present embodiment, too, the surface roughness of the obtained laminates is made less than lam, required work for passing the respective laminates through the cooling rollers 21 can be done sequentially more easily, and the required time for decreasing the temperature below the glass transition temperature of the resin can be shortened to be able to effectively shorten the manufacturing lead time.

Figure 4:
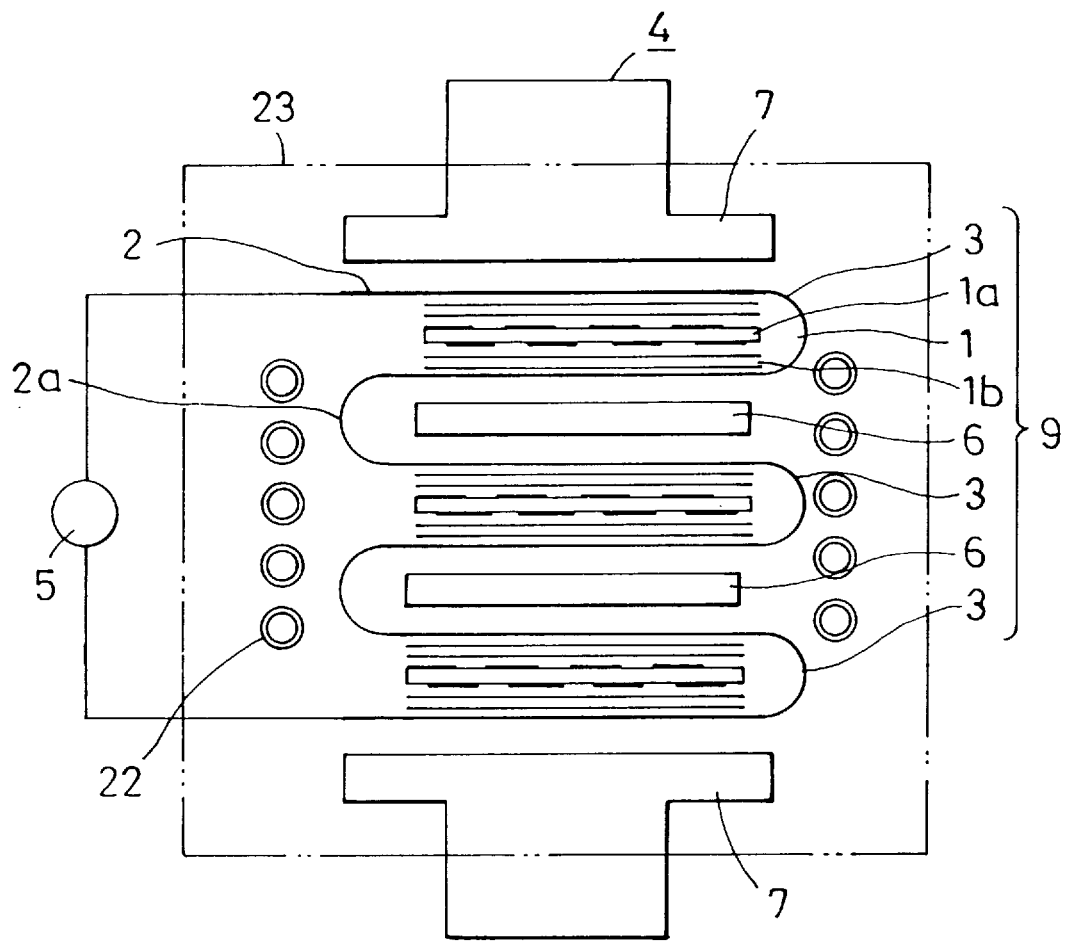
FIG. 4 is a schematic side elevation showing a laminate manufacturing apparatus in a third embodiment of the present invention.
Figure 5A:
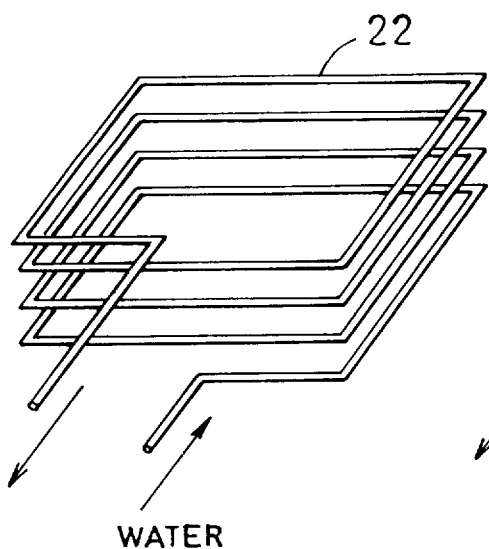
FIGS. 5A and 5B show, in perspective views of cooling pipe in the apparatus of FIG. 4, different aspects of cooling operation.
Figure 5B:
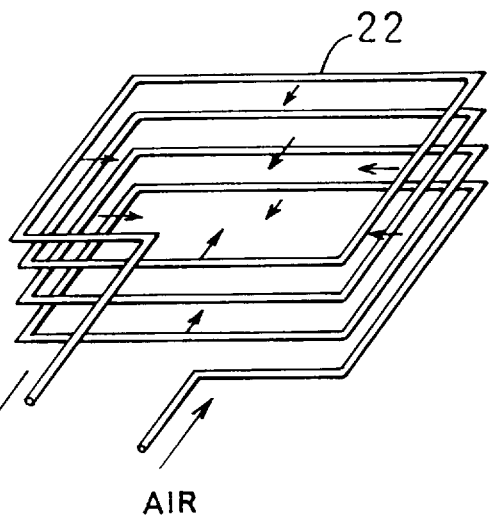

In FIGS. 4 and 5, a laminate manufacturing apparatus according to third embodiment of the present invention is shown, in which the cooling device employed in the first embodiment is replaced by a cooling pipe 22 disposed to surround the laminated block 9 set in the molding press 4, for cooling the heat and pressure molded laminates to be below the glass transition temperature of the epoxy resin with such refrigerant as water or air circulated through the cooling pipe 22. That is, the apparatus is constituted for having the obtained laminates cooled by the cooling pipe 22 while maintaining the pressing state after termination of the heating. In FIG. 5A, the cooling with water circulated is shown, whereas FIG. 5B shows a cooling state with air circulated, in the latter case of which the cooling pipe 22 is provided at proper positions with blow-off ports opened towards the laminated block 9, so that the cooling operation can be performed more efficiently by blowing cold air against the laminated block 9.

With such cooling under the pressure applied by means of the above cooling device in the molding press 4, too, it is possible to minimize the surface roughness of the obtained laminates to be less than 1 $\mu$m.

Further, in an event where the laminated block 9 is cooled through the natural heat radiation while being left in the molding press 4 with the pressure kept applied, it takes about 30 minutes until the temperature of the laminate decreases below the glass transition temperature of the resin, whereas the temperature decrease down below the glass transition temperature in the case of cooling by means of the surrounding cooling pipe 22 as in the above requires only about 2 minutes, to be effective to shorten the manufacturing lead time.

Further, with the provision of the cooling device around the laminates, it is enabled to simultaneously cool the laminates stacked in multiple stages, and the number of productions can be also increased.

Figure 6:
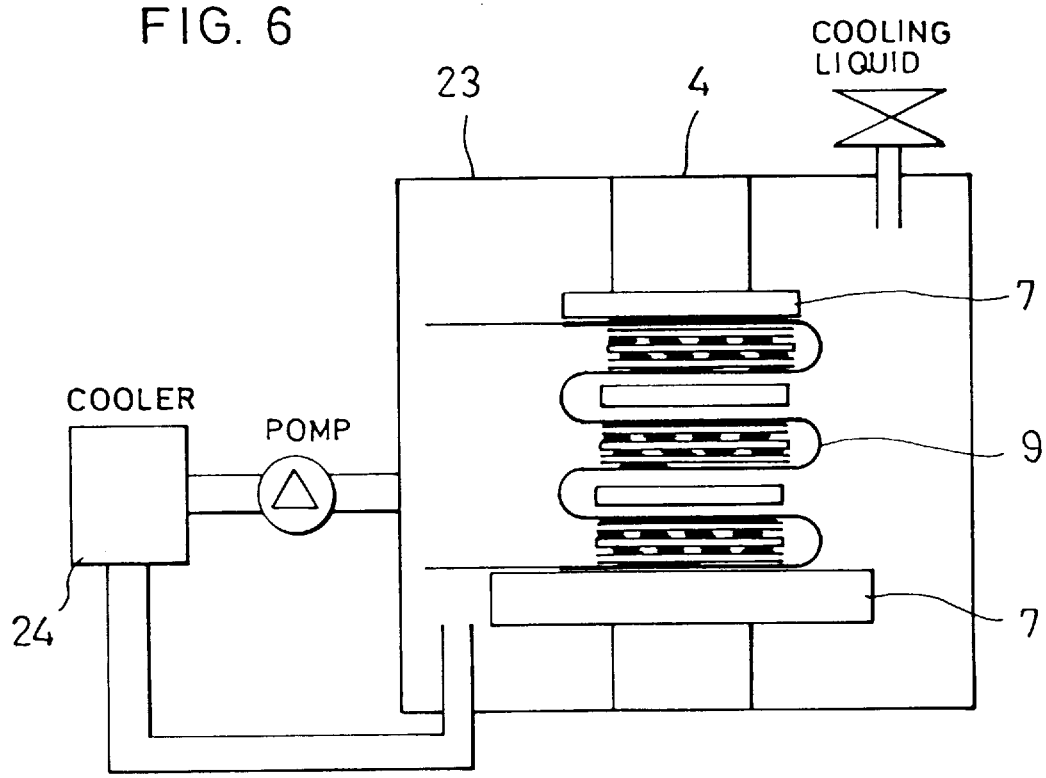
FIG. 6 shows in a schematic side elevation a laminate manufacturing apparatus in a fourth embodiment of the present invention.

In another laminate manufacturing apparatus of fourth embodiment shown in FIG. 6, the molding press 4 is adapted to a vacuum laminating press as shown in the first embodiment. In this case, after the termination of the heating, such refrigerant gas as air, nitrogen, ammonia or the like is supplied through a cooler 24 into the vacuum chamber 23 constituting the vacuum laminating press, so as to perform the cooling to be below the glass transition temperature of the epoxy resin constituting the laminate.

With this laminate manufacturing apparatus, too, the surface roughness of the obtained laminate can be minimized to be less than 1 $\mu$m through the cooling under the pressure applied. The required time for the temperature decrease to be below the glass transition temperature of the resin is about 2 minutes, and the manufacturing lead time can be shortened. With the provision of the cooling device surrounding the laminate, it is enabled to simultaneously cool the laminates stacked in multiple stages, and the production can be increased.

Figure 7:
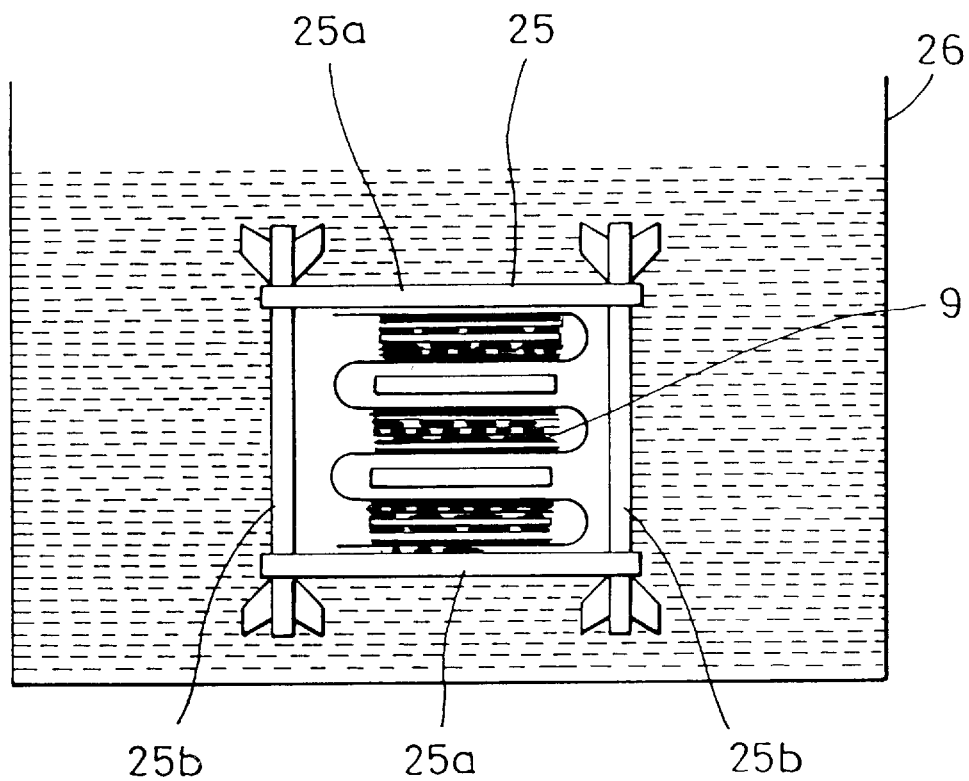
FIG. 7 is a schematic sectioned view showing a cooling state of a laminate manufacturing apparatus in a fifth embodiment of the present invention.

In fifth embodiment shown in FIG. 7, the laminated block 9 thermoformed under the pressure with the molding press 4 of the first embodiment is entirely released and set in a pressure jig 25 for compressing the laminated block 9 from above and below as a whole, and the thus set block 9 is dipped in a bath of such refrigerant as water or alcohol filled in a vessel 26, for cooling the block to be below the glass transition temperature of the epoxy resin. The pressure jig 25 comprises pressure plates 25a and compression rods 25b for coupling the plates in mutually opposing relationship, and the laminated block 9 held between the upper and lower pressure plates 25a is compressed by fastening the plates by means of the compression rods 25b.

With this laminate manufacturing apparatus, too, the laminate is cooled effectively while being pressed similarly to the above fourth embodiment, and the surface roughness of the obtained laminate can be minimized to be less than 1 $\mu$m. In the case of the cooling through the dipping in the refrigerant bath of the vessel 26, the time for the temperature decrease below the glass transition temperature is about 5 seconds, and the manufacturing lead time can be remarkably shortened. With the provision of the cooling device to surround the laminate, further, the simultaneous cooling of many laminates stacked in multiple stage is enabled, to increase the production.

Figure 8:
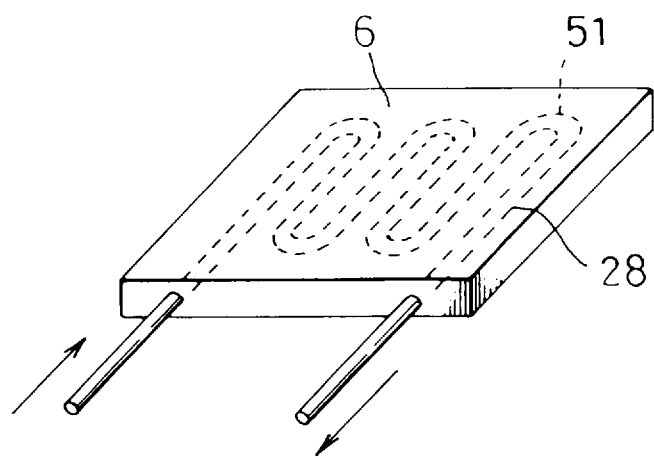
FIG. 8 shows in a schematic perspective view an interlayer employed in a laminate manufacturing apparatus in a sixth embodiment of the present invention.

In another laminate manufacturing apparatus of sixth embodiment as shown in FIG. 8, the cooling device employed in the first embodiment is modified by means of the interlayers 6 incorporating a cooling pipe 28 embedded in the interlayers, which pipe forming a path 51 of water, air or the like cooling fluid, for cooling the laminate to be below the glass transition temperature of the epoxy resin.

With this laminate manufacturing apparatus, too, the surface roughness of the obtained laminate can be minimized to be less than 1pm. Because the laminated block 9 is cooled from the interior by means of the interlayers 6 having the cooling pipe 28, it is possible to perform the cooling with a uniform temperature distribution, and the uniform surface roughness can be attained throughout the respective laminates and also throughout the central and circumferential parts of each laminate. In the case when the cooling is made by such interlayers 6, the required time for lowering the temperature below the glass transition temperature is about 3 minutes, and the manufacturing lead time can be effectively shortened.

Figure 9A:
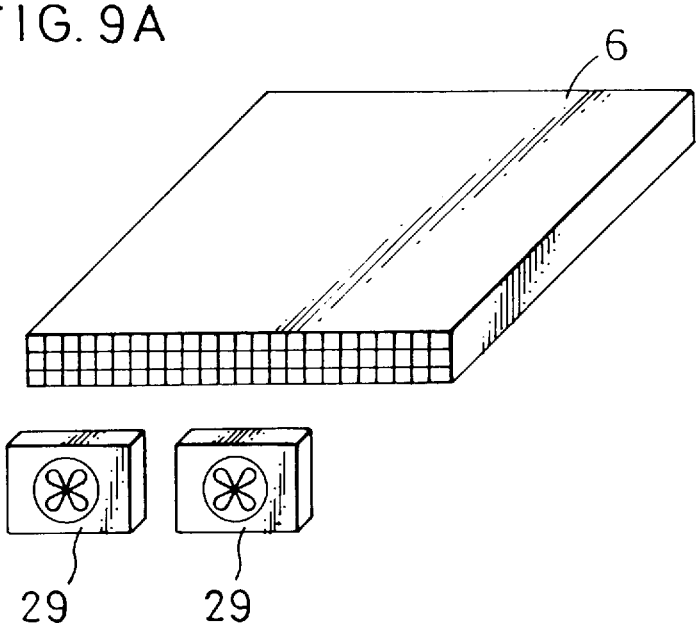
FIGS. 9A and 9B show schematically in perspective views in different cooling states the interlayer employed in an apparatus in a seventh embodiment of the present invention.
Figure 9B:
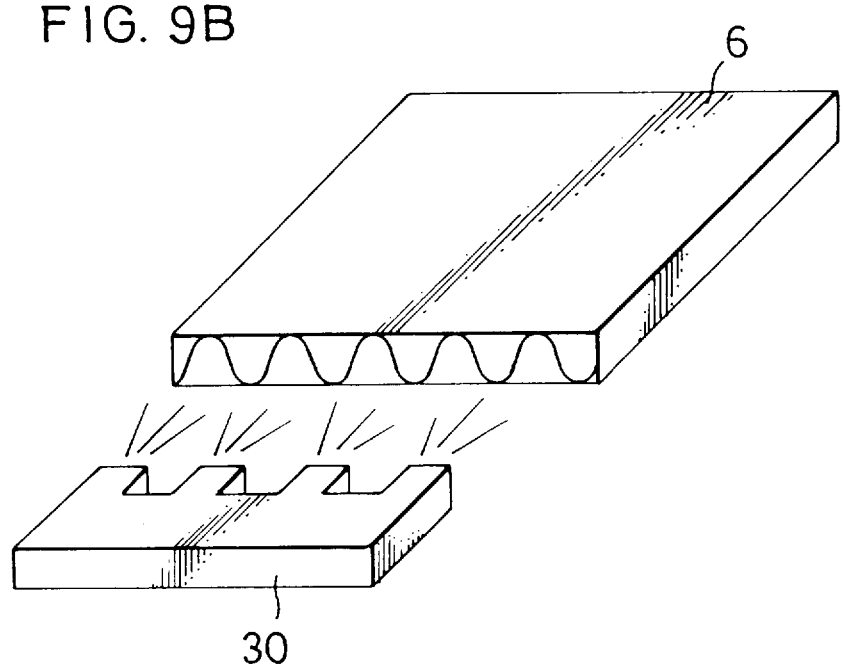

In another laminate manufacturing apparatus of seventh embodiment according to the present invention as shown in FIG. 9, the cooling device employed in the first embodiment is modified by forming the interlayers 6 to be of a heat sink type, in combination with means for cooling the heat sink interlayer from its lateral side. Practical examples are shown in FIGS. 9A and 9B, in the former of which the cooling means comprises fans 29, and in the latter of which the cooling means is a blower nozzle 30.

With this laminate manufacturing apparatus, too, it is possible to minimize the surface roughness of the obtained laminate to be less than 1 $\mu$m throughout the central and circumferential parts, because of the cooling made from the periphery while applying the pressure. In the case of the cooling by means of such interlayers 6 of heat sink type, further, the required time for lowering the temperature to be below the glass transition temperature of the resin constituting the laminate is about 5 seconds, and the manufacturing lead time can be much shortened.

Figure 10:
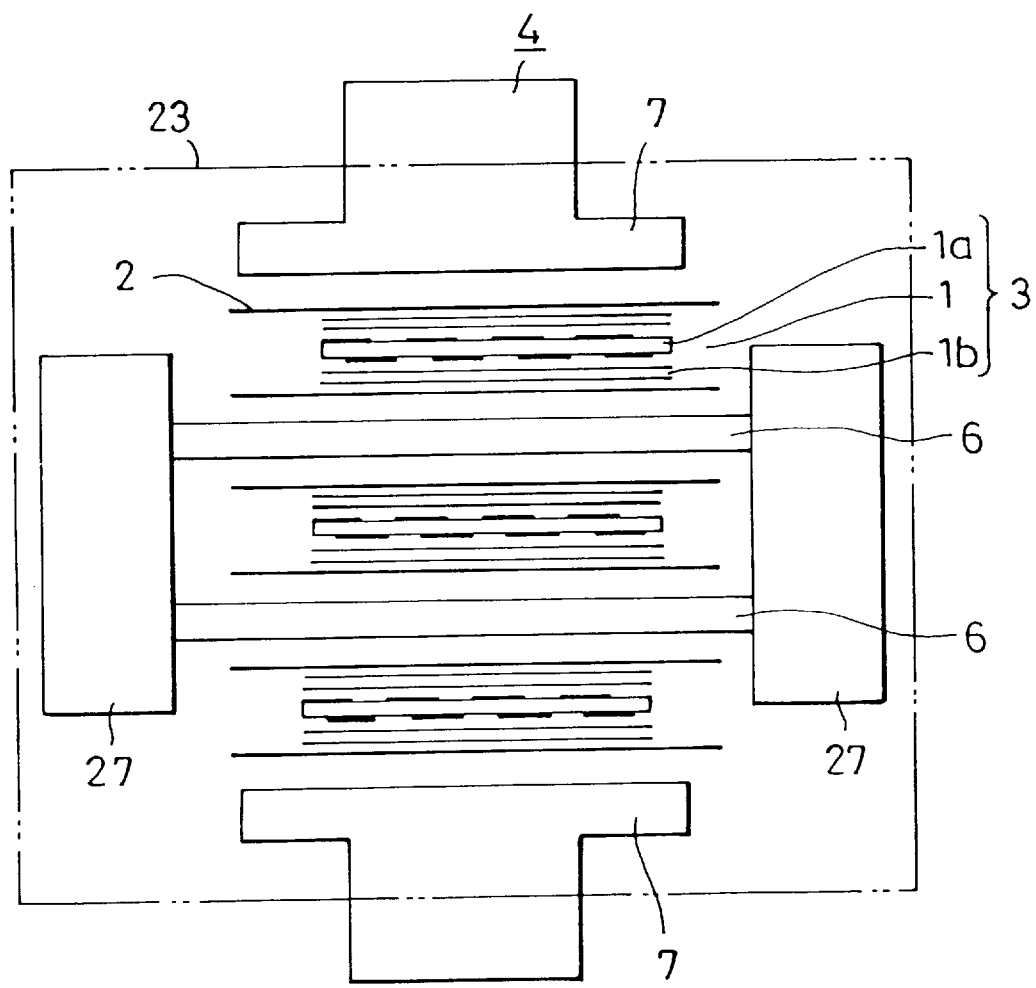
FIG. 10 shows in a schematic side elevation a laminate manufacturing apparatus in an eighth embodiment of the present invention.

In another laminate manufacturing apparatus of eighth embodiment shown in FIG. 10, the interlayers 6 are extended to both outer sides of the laminated combinations 3, and cooling members 27 of such structure as shown in the sixth embodiment of FIG. 8 and having the cooling pipe 28 are coupled to both extended ends of the interlayers 6, so as to cool the laminated combinations 3 through the interlayers 6 by means of the heat conduction. Instead of such coupling arrangement of the cooling members 27, it may be possible to have the extended parts of the interlayers 6 provided with fin-shaped cooling member, to be cooled by means of cooling air or the like blown to the cooling member. In the present embodiment, it may be possible to employ, as the metal foil 2, a single continuous sheet of the metal foil while folding back in front and rear directions.

With this laminate manufacturing apparatus, too, the surface roughness of the obtained laminate can be minimized to be less than 1 m, by cooling the laminate while applying thereto a pressure. Since, in particular, the laminated block 9 can be cooled from the interior by means of the interlayers 6, the cooling of uniform temperature distribution can be realized, and the surface roughness can be made uniform throughout the respective laminates and also throughout the central and circumferential parts of each laminate.

In the case when the laminate is cooled by means of the head conduction of the interlayers 6, the required time for lowering the temperature below the glass transition temperature of the resin forming the laminate is about 25 seconds, and the manufacturing lead time can be well shortened.

In a laminate manufacturing method of nineth embodiment as shown in FIGS. 11 to 13, the cooling is performed by transferring the laminated combinations 3 from the molding press 4 for the thermoforming to a pair of opposing cooling presses 50, after termination of the heating under the pressure.

More specifically, FIG. 11 shows a state in which the laminated block 9 is taken out of the molding presses 4, to be cooled by means of the cooling presses 50, which are of the same type as the foregoing cooling and molding presses 8 of FIG. 2, and the cooling plates 27 are formed by providing a flow path in the pressing plate 7 of the molding press 4 for performing the cooling with a cooling fluid led to flow through the path. In this case, all or part of the interlayers 6 forming the laminated block 9 may be formed for the cooling in the same manner as that shown in FIG. 8, so that the laminated block 9 can be cooled also from inside, to attain an efficient cooling.

According to such laminate manufacturing method, it is possible to perform the heating and cooling of the laminated combinations 3 side by side, to improve the productivity.

Figure 12A:
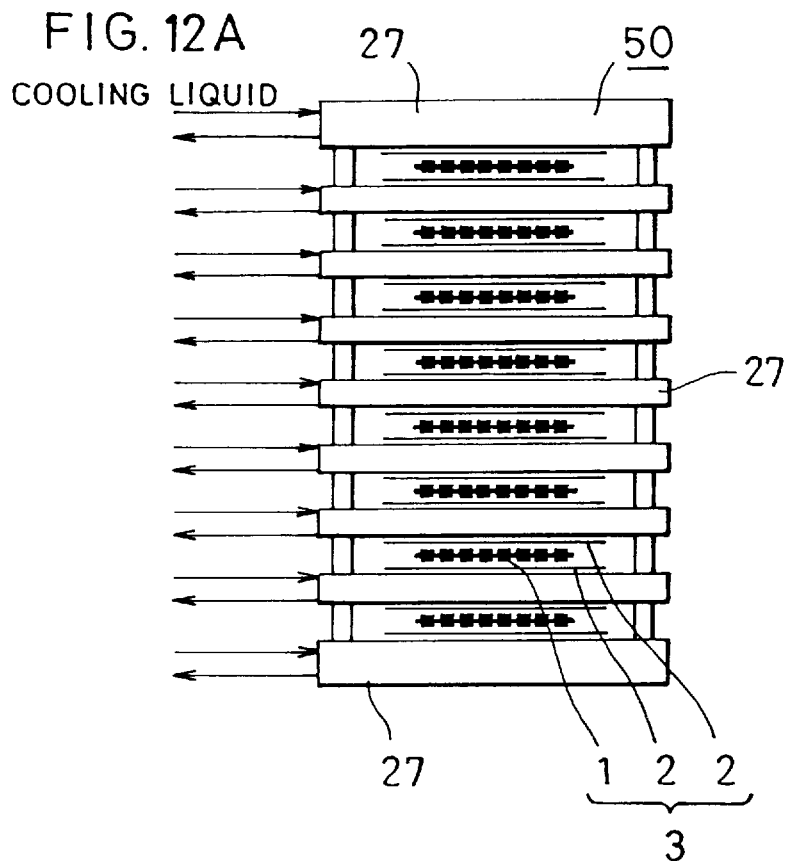
FIGS. 12A and 12B as well as FIGS. 13A and 13B are schematic explanatory views showing respectively different aspects of the apparatus of FIG. 11.

Further, as shown in a state of cooling of FIG. 12A, the laminated block 9 after being subjected to the thermoforming under the pressure is released and disassembed into individual laminated combination 3, the respective laminated combinations 3 disassembled are transferred to a cooling press 50 to be cooled in the unit of the individual laminated combination 3, and it is enabled to improve the method in the cooling speed. In this cooling press 50, there are provided a large number of the cooling plates 27, and the respective laminated combinations 3 are disposed between adjacent two of these cooling plates 27.

Figure 12B:
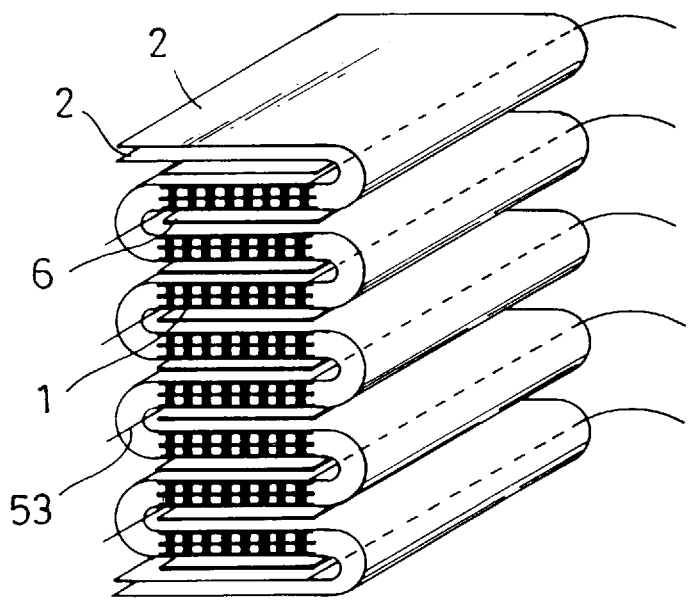

In this case, further, the disassembly into the individual one of the laminated combinations 3 can be executed by means of metal wires 53 each disposed inside each of the folds of the metal foil 2, as shown in FIG. 12B, the wires 53 being pulled at one end in outward direction to cut the foils 2 at the respective folds.

Figure 13A:
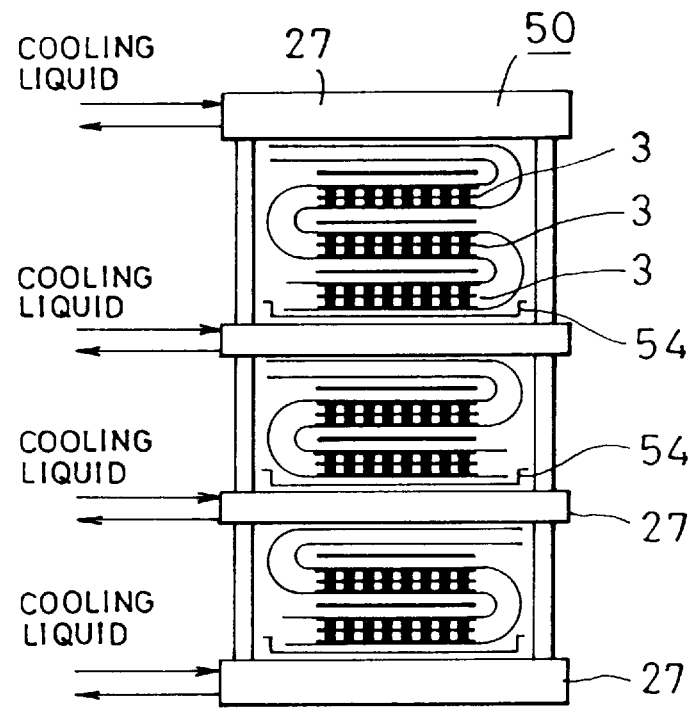
Figure 13B:
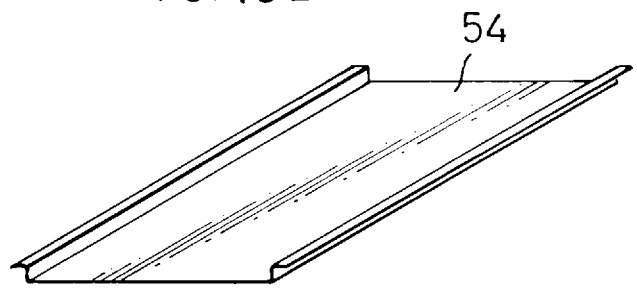

Further, as in the cooling state shown in FIG. 13A, it is also possible to disassemble the laminated block 9 after being subjected to the thermoforming under the pressure and being released into a plurality of the laminated combinations 3 as a unit, and to cool the laminated combinations 3 transferred to the cooling press 50 in the unit of the plurality of the laminated combinations 3. In this case, as shown in FIG. 3A, some of the interlayers 6 are replaced by such conveying plate or tray 54 as shown in FIG. 13B, so that mounting and dismounting of the plurality of laminated combinations 3 with respect to the cooling press 50 can be made with the respective units of the plurality of laminated combinations 3 placed on each of the conveying trays 54.

In the case of the above disassembly of the laminated block 9 into the plurality of the laminated combinations 3 as a unit, it is possible to render the working simpler than in the case of the release and disassembly in the individual one of the laminated combinations. When the laminated block 9 is disassembled into individual one of the laminated combinations 3, on the other hand, there arises an advantage that the cooling becomes faster.

Figure 14A:
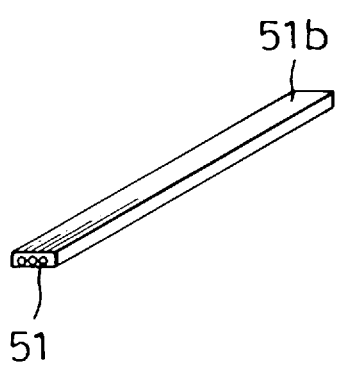
FIGS. 14A and 14B show in schematic perspective view an interlayer employed in a tenth embodiment of the present invention.
Figure 14B:
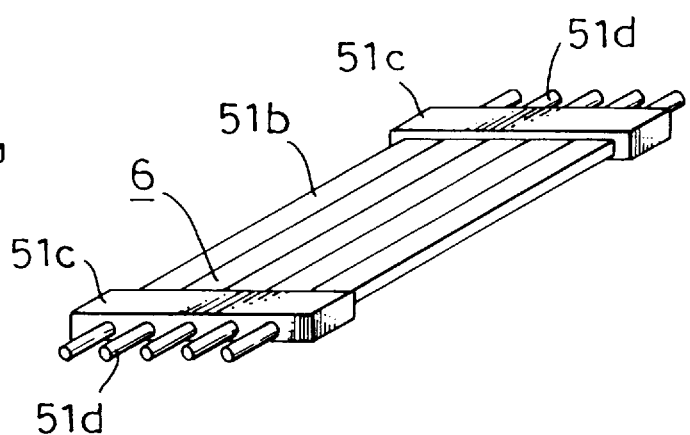

In a tenth embodiment shown in FIGS. 14A and 14B, the interlayer 6 is formed with a plurality of such interlayer units 51b as shown in FIG. 14A, each unit 51b being comprised of an extruded article of aluminum in an elongated, flat bar shape having rectangular cross section and including a flow path 51 made through in longitudinal direction for flowing a cooling fluid, and a plurality of the interlayer units 51b are flatly bundled side by side by means of a pair of manifolds 51c, as shown in FIG. 14B, while the manifolds 51c are provided respectively with short connecting pipes 51d communicating with the flow paths 51 and projecting on their inlet and outlet sides.

With the interlayer 6 of such composite units 51b as above, the cooling can be performed by flowing air or the like cooling fluid through the flow paths 51. Further, it is possible to form the composite interlayer 6 having any optional width by properly selecting the number of the interlayer units 51b to be bundled side by side, and also to render the composite interlayer 6 repairable as a whole in case of partial damage by exchanging only damaged one or ones of the interlayer units 51b.

Further, the interlayer 16 can be optimumly formed in such different aspects as in the followings.

Figure 15:
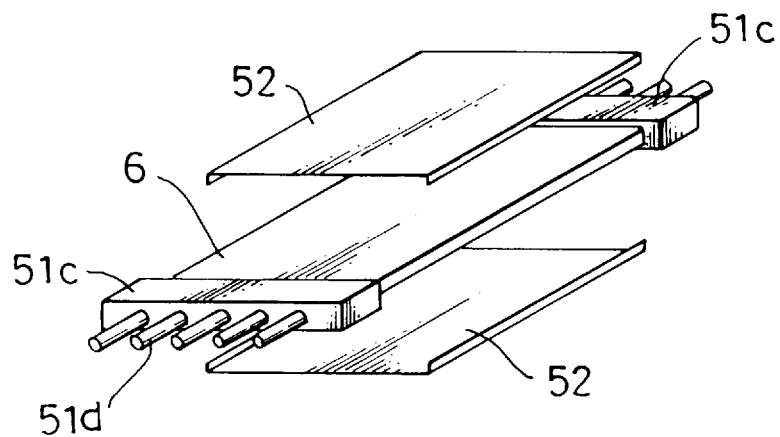
FIG. 15 is a schematic perspective view of an interlayer in a different aspect from that of FIG. 14.

That is, as shown in FIG. 15, the interlayer units 51b are reliably integralized by means of protecting plates 52 fitted to both upper and lower sides of the units 51b so that, when the interlayer 6 is flawed as scratched or the like, the interlayer 6 can be repaired by exchanging the scratched protecting plate 52 of the interlayer 6 or polishing scratched part only of the plate.

Figure 16:
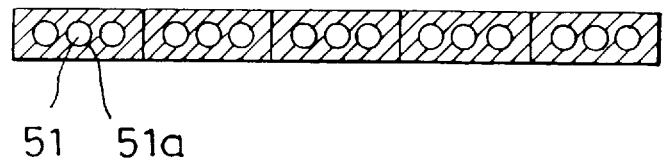
FIG. 16 is a schematic sectioned view of an interlayer in a different aspect from that of FIG. 14.

Further, as shown in FIG. 16, the interlayer 6 may be formed to improve the cooling efficiency by providing at least a raised line 51a on the inner wall for increasing the surface area of the inner wall of the flow path 51.

Further, the interlayer 6 may be formed as integrally extruded from the beginning.

In order to form an electrically insulating layer on the surface of the interlayer 6, further, it is desirable to have the interlayer 6 subjected to a treatment for forming a hard anodized aluminum, and then to a Teflon (Trademark) treatment by impregnating the surface anodized-aluminum treated with ethylene 4-fluoride or the like. This electrically insulating layer is formed to be about 30 to 60 $\mu$m thick, and the interlayer 6 is made electrically insulative, so that the laminated block 9 can be formed by bringing the metal foil 2 into contact directly with the surface of this insulating interlayer 6. That is, the work for forming the laminated block 9 can be made easier since it is not required to interpose any insulating sheet. In the present case, in particular, the surface of the interlayer 6 can be made not scratchable by raising surface hardness by means of the hard anodised-aluminum treatment and by improving the slidability by means of the Teflon treatment. In the case when the protecting plates 52 are employed, it is preferable to form such electrically insulating layer on the surface of the protecting plate 52.

Figure 17A:
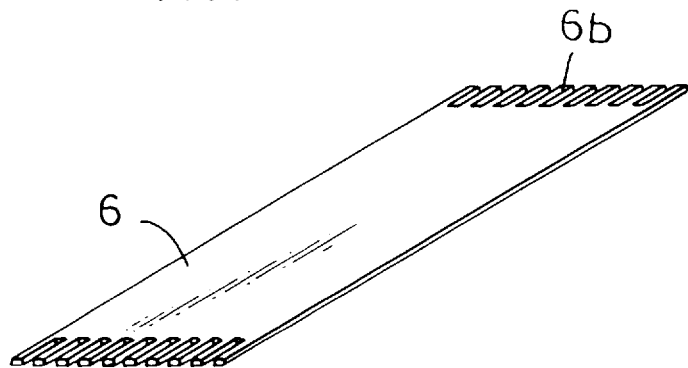
FIG. 17A shows in a schematic perspective view an interlayer in a different aspect from that of FIG. 15.
Figure 17B:
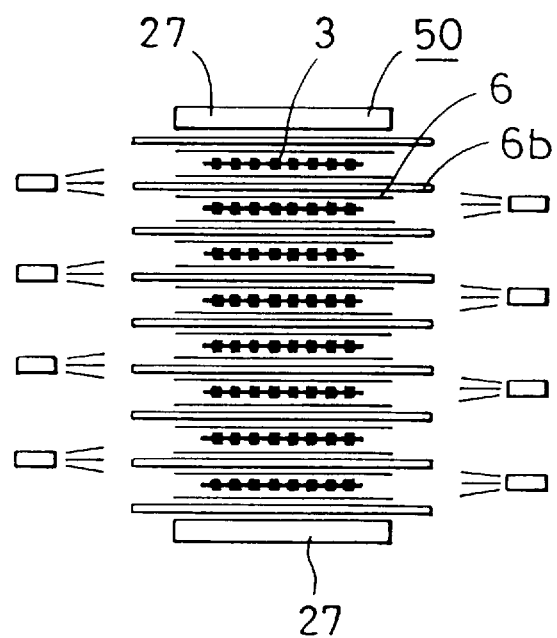
FIG. 17B shows in a schematic side elevation a state in which the interlayers of FIG. 17A are used.

Further, as shown in FIG. 17A, it is also preferable that the cooling is so arranged that the interlayer 6 is provided, instead of providing the interior flow path 51 of the cooling fluid, with such heat-radiating undulated edges 6b along opposing sides as shown in FIG. 17A, and cooling air is blown against the undulated edges 6b for cooling the interlayer 6 as shown in a state of use of FIG. 17B. The undulated edges 6b act as cooling fins and the interlayer 6 can be efficiently cooled. Instead of the cooling air, it is possible to use liquid nitrogen for further improving the cooling efficiency.

In cooling the foregoing sheet-shaped synthetic resin material 1, it is preferable to cool such material 1 while applying a pressure until the temperature reaches below the glass transition temperature of the resin which constitutes the sheet-shaped synthetic resin material 1, and the pressure application is not particularly required once the temperature below the glass transition temperature of the resin is reached. That is, when the pressure is released at a temperature above the glass transition temperature, the obtained laminate is caused to be deteriorated in the surface roughness due to the striking of weave pattern of the glass fiber substrate, whereas the surface smoothness of the laminate is fixed when the temperature below the glass transition temperature is reached, and the laminate excellent in the surface smoothness can be obtained.

Therefore, the disassembly of the laminated block 9 into the individual one of the laminated combinations 3 after reaching the temperature below the glass transition temperature of the resin enables it possible to rapidly cool the laminated combinations 3 in the unit of individual one of them by means of the air blow or the like, and to perform an efficient and quick cooling to further lower temperature easy to deal with.

In FIGS. 18A to 18D, there are shown practical examples of temperature measurement with respect to the sheet-shaped synthetic resin material 1 upon such cooling as in the above.

Figure 18A:
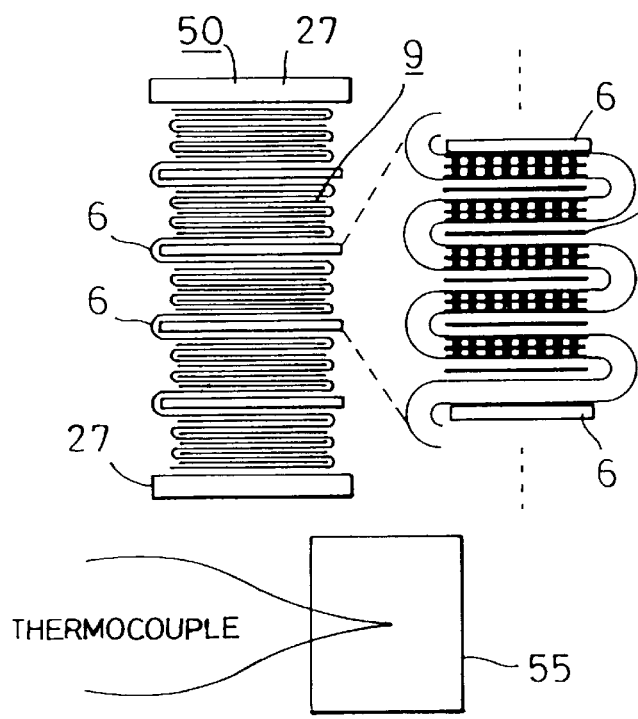
FIGS. 18A to 18D are explanatory views for respectively different examples of temperature measuring in respect of the sheet-shaped synthetic resin material upon cooling with the interlayer of FIG. 15.
Figure 18B:
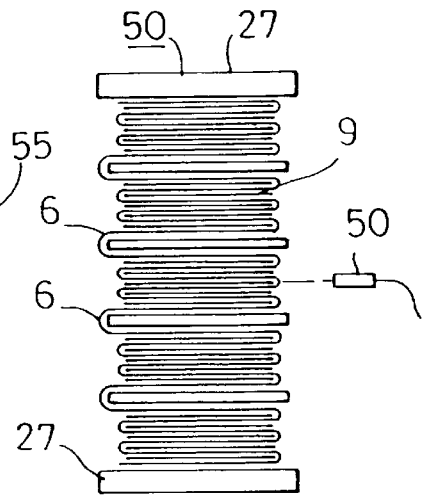
Figure 18C:
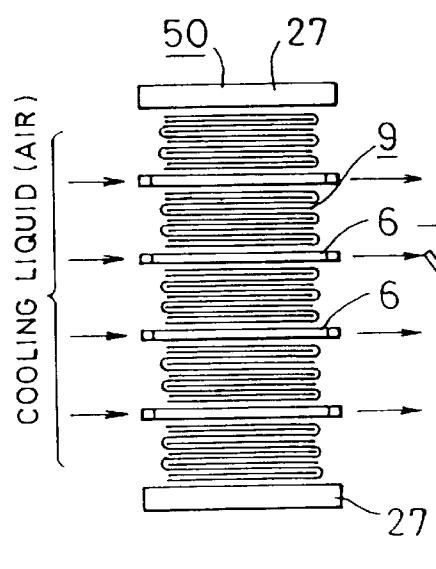
Figure 18D:
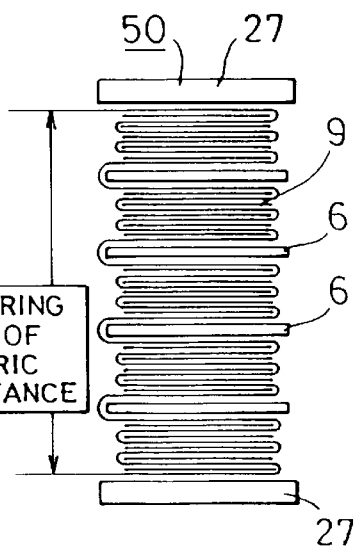

In this case, as shown in FIG. 18A, a timing of terminating the pressure application can be discriminated by measuring the temperature of a dummy plate 55 carrying the thermocouple and disposed in the central area of the laminated block 9. It is also possible to discriminate the timing of termination of the pressure application with a radiation thermometer 56 employed as shown in FIG. 18B for measuring the temperature of the laminated block 9 in non-contact manner, and presuming therefrom the temperature of the sheet-shaped synthetic resin material 1. It is further possible to discriminate the timing of termination of the pressure application, as shown in FIG. 18C, by measuring the temperature at outlet port of air as the cooling fluid for cooling the interlayers 6, and presuming therefrom the temperature of the sheet-shaped resin material 1. Further, as shown in FIG. 18D, the timing of termination of pressure application can be also discriminated by measuring the electric resistance value of the metal foil 2 and presuming therefrom the temperature of the sheet-shaped resin material 1.

Further, the cooling of the laminated block 9 as has been described should preferably be performed to attain a uniform cooling in such manner as in the followings. That is, as shown in FIGS. 19A to 19C, the sheet-shaped resin material 1 should optimumly be cooled by causing the flowing direction of the cooling fluid through the respective interlayers 6 including the many fluid paths 51 arranged side by side to be different between the adjacent two of the flow paths 51.

Figure 19A:
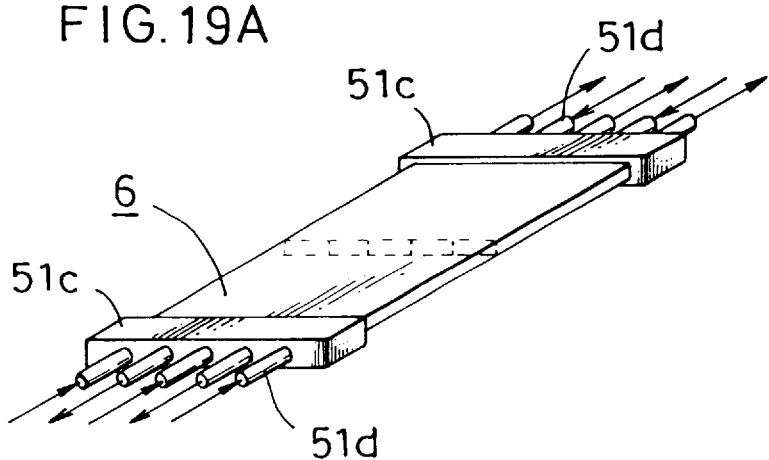
FIG. 19A is an explanatory perspective view showing a cooling state with the interlayer of FIG. 15.
Figure 19B:
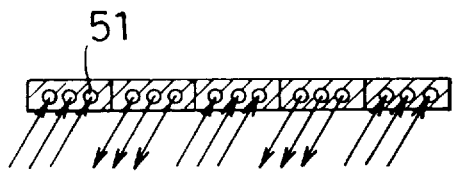
FIG. 19B is a sectioned view of the interlayer shown in FIG. 19A.
Figure 19C:
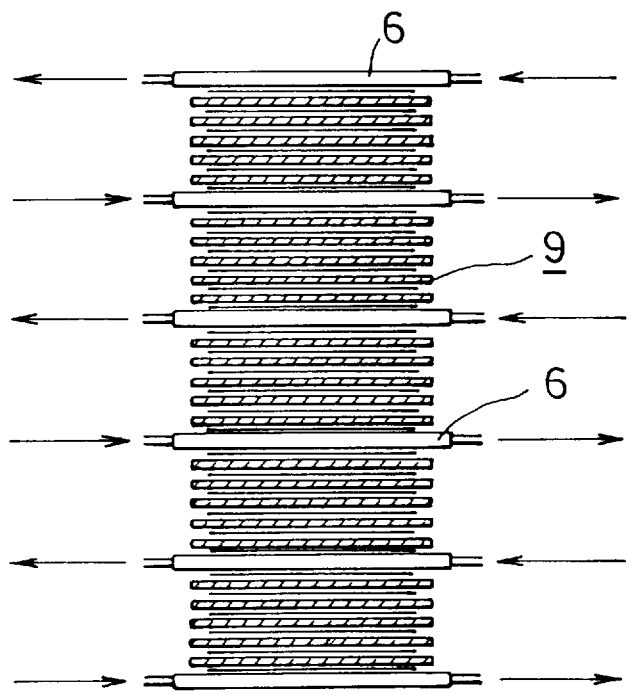
FIG. 19C is a side elevation of the laminated block in the example of FIG. 18A.

More specifically, the interlayers 6 are formed respectively with five interlayer units 51b arranged integrally side by side, as seen in FIGS. 19A and 19B. In each interlayer unit 51b, three of the flow paths 51 for the cooling fluid are formed, and each of the connecting pipes 51d is connected to the three paths 51. Then, the cooling fluid is made to flow through each interlayer 6 to be alternately different in the flowing direction between the adjacent two of the interlayer units 51b as shown in FIG. 19B, and also through the respective interlayers 6 forming the laminated block 9 to be alternately different in the flowing direction between the adjacent two of the interlayers 6 as shown in FIG. 19C.

Because of such different flowing direction of the cooling fluid between the adjacent flow paths 51, any difference in cooling effect due to any temperature difference of the cooling fluid between the inlet and outlet ports of the flow paths 51 can be averaged in both of horizontal and vertical directions of the laminated block 9, and the uniform cooling of the entire block 9 can be attained.

In view that the cooling is harder as the position approaches the center of the laminated block 9, it is preferable to perform the cooling with such arrangement as follows.

That is, as shown in FIGS. 20A to 20E, the cooling fluid is made to flow through the respective interlayers 6 at a higher flow rate as the position becomes closer to the central zone of the laminated block 9, for cooling the sheet-shaped synthetic resin materials 1, and the whole of the laminated block 9 can be uniformly cooled. More concretely, as shown in FIG. 20A, the flow paths 51 in the respective interlayers 6 are distributed to be more dense as the center of the interlayer approaches or, as shown in FIG. 20B, the flow path 51 is formed to be gradually increased in the cross sectional area as the center approaches in an event where the respective flow paths 51 are distributed substantially at regular intervals.

In an event when the flow paths 51 substantially of the same cross sectional area are disposed substantially at regular intervals, it is made possible to attain substantially the same effect as the case where the foregoing interlayers 6 of FIG. 20A or 20B are employed and to cool the laminated block 9 uniformly to the core part of the block, by performing the cooling under the control for supplying the cooling fluid of a larger flow rate or of a lower temperature as the center of the interlayer 6 approaches.

In respect of the height direction of the laminated block 9, too, it is made possible to cool the laminated block 9 uniformly to the core by employing the interlayers 6 having the flow paths 51 disposed more dense as the center approaches as shown in FIG. 20C or the flow paths 51 made larger in the cross sectional area as the center approaches as shown in FIG. 20D. It is also possible to attain the same effect and to cool the laminated block 9 uniformly to its core part, by increasing more the flow rate of the cooling fluid or by lowering more the temperature of the fluid as the center of the block approaches.

Further, as shown in FIG. 20E, the cooling may be performed also by reducing the number of the sheet-shaped synthetic resin materials 1 disposed between adjacent two of the interlayers 6 to be lesser as the center of the laminated block 9 approaches, so that the block can be cooled properly to the core, and the uniform cooling to the core of the block can be attained.

Further as shown in FIGS. 21A to 21D, it is preferable in the following respects to cool the respective sheet-shaped resin materials 1 by connecting the flow paths 51 of adjacent two of the interlayers 6 in the laminated block 9 to each other by means of connecting pipes 52' and supplying the cooling fluid of lower temperature to the respective flow paths 51 while cooling the connecting pipes 52' intermediately.

That is, the cooling fluid is not required to be supplied to every one of the interlayers 6 but is to be supplied only to part of the interlayers 6 as the supplied fluid is conveyed through the connecting pipes 52' to the remaining interlayers 6, so that inlet and outlet ports of the cooling fluid can be reduced in number, and the supply of the cooling fluid can be performed in a simpler manner. Further, in the case when air is used as the cooling fluid and is made to be discharged out of the outlet to the atmosphere, it is enabled to reduce supply rate of the cooling fluid and to restrict any discharging noise of the cooling fluid to be lower.

Figure 21A:
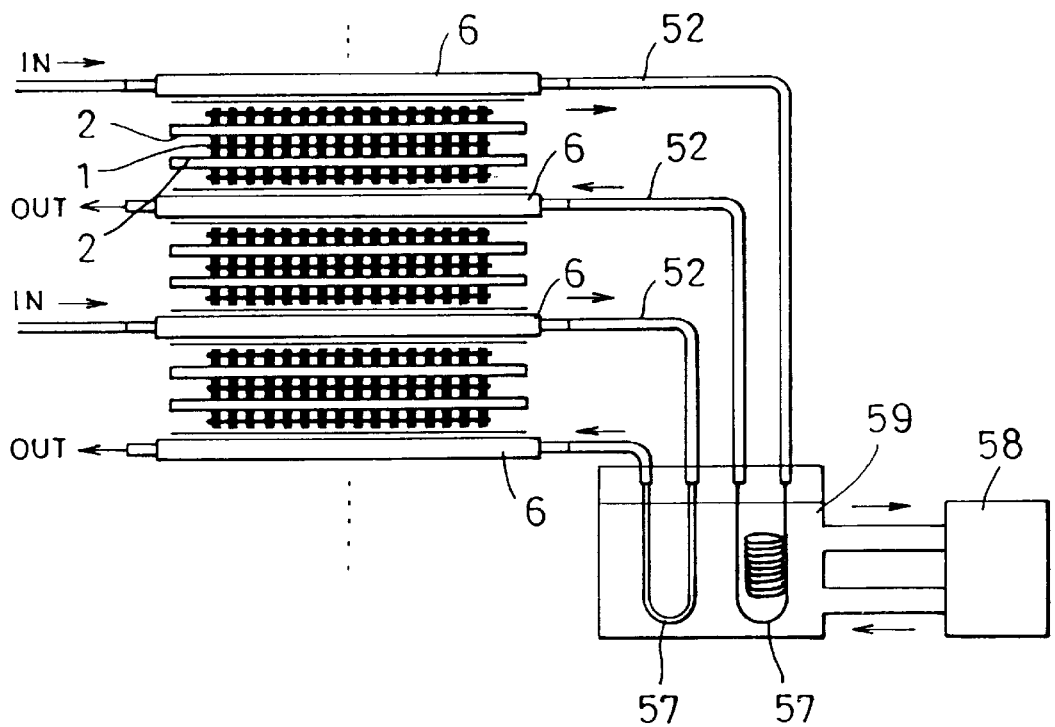
FIG. 21A is a schematic side elevation of the laminated block along with associated cooling means and others for explaining another aspect of cooling with the interlayer of FIG. 15 employed.

In the arrangement shown in FIG. 21A, more specifically, the connecting pipes 52' made of such as Teflon (Trademark) tubes are employed for connecting the flow paths 51 of the interlayers 6 mutually adjacent in vertical direction, and such cooling member 57 as a U-shaped pipe or spiral pipe made of copper is provided intermediately in each connecting pipe 52', the cooling member 57 being dipped in a cooling vessel 59 to which a cooler 58 is connected, for cooling the cooling fluid.

Figure 21B:
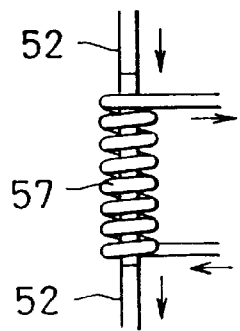
FIGS. 21B to 21D show in side elevations respectively different cooling means from that of FIG. 21A.
Figure 21C:
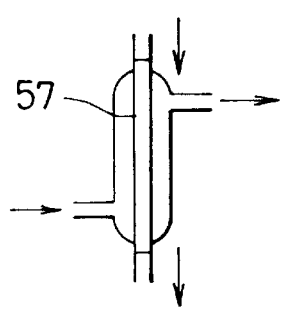
Figure 21D:
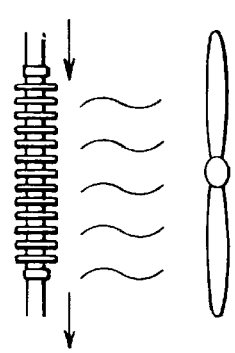

The cooling member 57 may also be constituted as shown in FIGS. 21B to 21D. That is, in FIG. 21B, the connecting pipe 52' is made linear and the cooling member 57 is made as a spiral copper pipe surrounding the pipe 52' for cooling the latter with a cooling fluid passed through the member 57. In FIG. 21C, the connecting pipe 52' is covered with the cooling member 57 in the form of an outer tube surrounding the pipe 52' and passing the cooling fluid therethrough. In FIG. 21D, the cooling member 57 in the form of a copper-made cooling fin is mounted on outer periphery of the connecting pipe 52' to be cooled by a blown air.

What is claimed is:

1. A method for manufacturing a laminate, comprising the steps of:

forming a plurality of laminated combinations with sheet-shaped synthetic resin materials and metal foils laminated with each other;

forming at least a laminated block by stacking the laminated combinations with electrically insulating interlayers respectfully interposed between the laminated combinations and with a pair of pressing plates disposed at least on both surfaces of the laminated block in the stacking direction of the laminated combinations;

forming cooling means at least in the interlayer with as plurality of elongated interlayer units each having a plurality of longitudinally extending fluid flow paths substantially enclosed within the respective interlayer units and bundled flatly side by side at both longitudinal ends by a pair of manifolds having connecting pipes, the interlayer units having side surfaces arranged such that adjacent side surfaces are in contact;

thermoforming the laminated block under a pressure applied thereto through the pair of pressing plates, while supplying an electric current to the metal foils in the laminated block to generate heat by the metal foils for heating the laminated block; and cooling the laminated block after termination of the thermoforming with a cooling fluid supplied at least to the cooling means of the respective interlayer through the connecting pipes to fluid flow paths in the interlayers while maintaining the pressure applied to obtain the laminate.

2. The method according to claim 1 further including the step of forming the cooling means in the pair of the pressing plates with the fluid flow paths, the cooling fluid being also supplied to said cooling means in the pressing plates in the cooling step.

3. The method according to claim 1 further including the step of covering at least the interlayer units flatly bundled by the manifolds of the interlayers with protective plates on both sides.

4. The method according to claim 1 further including the steps of:

stacking a plurality of the laminated blocks on each other; and interposing the interlayers with the cooling means formed therein between the respective blocks.

* * * * *